(12) United States Patent
Van Zyl

(10) Patent No.: US 8,344,704 B2
(45) Date of Patent: Jan. 1, 2013

(54) METHOD AND APPARATUS FOR ADJUSTING THE REFERENCE IMPEDANCE OF A POWER GENERATOR

(75) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 396 days.

(21) Appl. No.: 12/650,753

(22) Filed: Dec. 31, 2009

(65) Prior Publication Data

US 2010/0174420 A1 Jul. 8, 2010

Related U.S. Application Data

(60) Provisional application No. 61/141,823, filed on Dec. 31, 2008.

(51) Int. Cl.
| | |
|---|---|
| H02J 1/00 | (2006.01) |
| H02J 3/00 | (2006.01) |
| H02P 11/00 | (2006.01) |
| H02P 9/00 | (2006.01) |
| H02H 7/06 | (2006.01) |

(52) U.S. Cl. ............ 322/8; 322/36; 702/107; 326/30; 333/17.3; 315/111.21

(58) Field of Classification Search .......... 322/8, 36; 702/107; 326/30; 333/17.3; 315/111.21
See application file for complete search history.

(56) References Cited

U.S. PATENT DOCUMENTS

| | | | | |
|---|---|---|---|---|
| 3,647,925 | A * | 3/1972 | Schilling | 250/208.2 |
| 3,818,480 | A * | 6/1974 | West | 342/435 |
| 3,900,875 | A * | 8/1975 | Scheets | 342/68 |
| 4,095,198 | A * | 6/1978 | Kirby | 333/32 |
| 4,375,051 | A * | 2/1983 | Theall | 333/17.3 |
| 4,521,728 | A * | 6/1985 | Li | 324/638 |
| 4,621,242 | A * | 11/1986 | Theall et al. | 333/17.3 |
| 4,951,009 | A * | 8/1990 | Collins | 333/17.3 |
| 4,965,607 | A * | 10/1990 | Wilkins et al. | 343/861 |
| 5,079,507 | A * | 1/1992 | Ishida et al. | 324/645 |
| 5,175,472 | A * | 12/1992 | Johnson et al. | 315/111.21 |
| 5,187,454 | A * | 2/1993 | Collins et al. | 333/17.3 |
| 5,195,045 | A * | 3/1993 | Keane et al. | 702/107 |
| 5,274,333 | A * | 12/1993 | Ghannouchi et al. | 324/638 |
| 5,314,603 | A * | 5/1994 | Sugiyama et al. | 204/298.32 |
| 5,357,423 | A * | 10/1994 | Weaver et al. | 700/28 |
| 5,512,736 | A * | 4/1996 | Kang et al. | 219/750 |
| 5,576,629 | A * | 11/1996 | Turner et al. | 324/709 |
| 5,621,331 | A * | 4/1997 | Smith et al. | 324/645 |
| 5,629,653 | A * | 5/1997 | Stimson | 333/17.3 |
| 5,654,679 | A * | 8/1997 | Mavretic et al. | 333/17.3 |
| 5,831,479 | A * | 11/1998 | Leffel et al. | 330/124 D |
| 5,867,060 | A * | 2/1999 | Burkett et al. | 330/2 |
| 5,939,886 | A * | 8/1999 | Turner et al. | 324/464 |
| 6,005,398 | A * | 12/1999 | Landt | 324/650 |
| 6,020,794 | A * | 2/2000 | Wilbur | 333/17.1 |
| 6,192,318 | B1 * | 2/2001 | Yogo et al. | 702/65 |
| 6,657,394 | B2 * | 12/2003 | Nasman | 315/111.21 |

(Continued)

*Primary Examiner* — Pedro J Cuevas
(74) *Attorney, Agent, or Firm* — Neugeboren O'Dowd PC

(57) ABSTRACT

A method and apparatus for allowing the user of a power generator coupled to a time-varying load, to define an alternative reference impedance to enable on or more metrics to be provided relative to the alternative reference impedance. The metrics, for example, may provide indicia of performance of the power generator system. One illustrative embodiment provides a power delivery system that applies power to a plasma chamber to create a plasma therein; determines a reference impedance of the plasma at an operating condition; and controls the power delivery system based on the determined reference impedance.

15 Claims, 3 Drawing Sheets

U.S. PATENT DOCUMENTS

| | | | |
|---|---|---|---|
| 6,703,908 B1 * | 3/2004 | Ruesch et al. | 333/17.3 |
| 6,778,921 B2 * | 8/2004 | Keane et al. | 702/62 |
| 6,819,052 B2 * | 11/2004 | Kitamura et al. | 315/111.21 |
| 6,949,949 B2 * | 9/2005 | Lundberg | 326/30 |
| 6,985,008 B2 * | 1/2006 | Lundberg | 326/30 |
| 6,998,875 B2 * | 2/2006 | Lundberg | 326/87 |
| 7,176,634 B2 * | 2/2007 | Kitamura et al. | 315/111.21 |
| 7,326,872 B2 * | 2/2008 | Shannon | 219/121.41 |
| 7,570,028 B2 * | 8/2009 | van Zyl | 322/36 |
| 7,812,278 B2 * | 10/2010 | Shannon | 219/121.41 |
| 7,831,226 B2 * | 11/2010 | Kwon et al. | 455/121 |
| 7,839,223 B2 * | 11/2010 | Van Zyl et al. | 331/35 |
| 7,970,562 B2 * | 6/2011 | van Zyl | 702/60 |
| 8,004,251 B2 * | 8/2011 | van Zyl | 322/36 |
| 8,053,991 B2 * | 11/2011 | Kim et al. | 315/111.21 |
| 8,072,285 B2 * | 12/2011 | Spears et al. | 333/17.3 |
| 8,120,259 B2 * | 2/2012 | Kim et al. | 315/111.21 |
| 8,258,874 B2 * | 9/2012 | Van Zyl | 330/297 |
| 2004/0113652 A1 * | 6/2004 | Lundberg | 326/30 |
| 2004/0113653 A1 * | 6/2004 | Lundberg | 326/30 |
| 2004/0113654 A1 * | 6/2004 | Lundberg | 326/30 |
| 2005/0040845 A1 * | 2/2005 | Park | 326/30 |
| 2008/0270048 A1 * | 10/2008 | van Zyl | 702/57 |
| 2009/0237170 A1 * | 9/2009 | Van Zyl et al. | 331/127 |
| 2009/0278598 A1 * | 11/2009 | van Zyl | 330/110 |
| 2010/0168932 A1 * | 7/2010 | Van Zyl | 700/295 |
| 2011/0148303 A1 * | 6/2011 | Van Zyl et al. | 315/111.21 |
| 2011/0163935 A1 * | 7/2011 | de Jongh et al. | 343/861 |
| 2011/0193568 A1 * | 8/2011 | Wang et al. | 324/649 |
| 2011/0234316 A1 * | 9/2011 | Kim et al. | 330/192 |
| 2012/0188007 A1 * | 7/2012 | Van Zyl et al. | 327/574 |
| 2012/0218042 A1 * | 8/2012 | Mueller et al. | 330/278 |

* cited by examiner

METHOD AND APPARATUS FOR ADJUSTING THE REFERENCE IMPEDANCE OF A POWER GENERATOR

PRIORITY

This application claims priority to provisional application No. 61/141,823 entitled METHOD AND APPARATUS FOR ADJUSTING THE REFERENCE IMPEDANCE OF A POWER GENERATOR.

FIELD

The present disclosure relates generally to electrical generators. In particular, but not by way of limitation, the present disclosure relates to methods and apparatuses for managing an application of power with a power generator.

BACKGROUND

Power generators are typically designed for optimal performance into a specific load impedance, often referred to as a "reference impedance." Typically, but not always, the reference impedance of power generators is 50 ohms. Operating into a load impedance close to the designed reference impedance typically results in the most efficient operation of the power generator, the highest output power capability, the lowest stress on the components internal to the generator, and zero (or near zero) reflected power (a measure of operational effectiveness) back to the generator from the load.

SUMMARY

Illustrative embodiments of the present disclosure are shown in the drawings and summarized below. These and other embodiments are more fully described in the Detailed Description section. It is to be understood, however, that there is no intention to limit the claims to the forms described in this Summary or in the Detailed Description. One skilled in the art can recognize that there are numerous modifications, equivalents, and alternative constructions that fall within the spirit and scope of this disclosure as expressed in the claims.

One illustrative embodiment includes a power generator, comprising a power delivery system configured to have a predefined reference impedance; a load, coupled to the power delivery system, having an operational impedance that is different than the predefined reference impedance of the power delivery system; and a performance assessor, coupled to the power delivery system, where the performance assessor is configured to receive information about the operational impedance of the load and is configured to assess operational efficiency of the power delivery system as it delivers power to the load, the assessed operational efficiency being relative to the operational impedance of the load.

Another illustrative embodiment comprises a method of controlling a power generation system, comprising providing a power delivery sub-system having a predefined reference impedance; providing a load having an operational impedance different from the predefined reference impedance of the power delivery sub-system; delivering power from the power delivery sub-system to the load; and determining the operational efficiency of the power generation system with respect to the operational impedance of the load.

These and other embodiments are described in further detail herein.

BRIEF DESCRIPTION OF THE DRAWINGS

Various objects and advantages and a more complete understanding of the present disclosure are apparent and more readily appreciated by reference to the following Detailed Description and to the appended claims when taken in conjunction with the accompanying Drawings, wherein:

DETAILED DESCRIPTION

Figure 1:
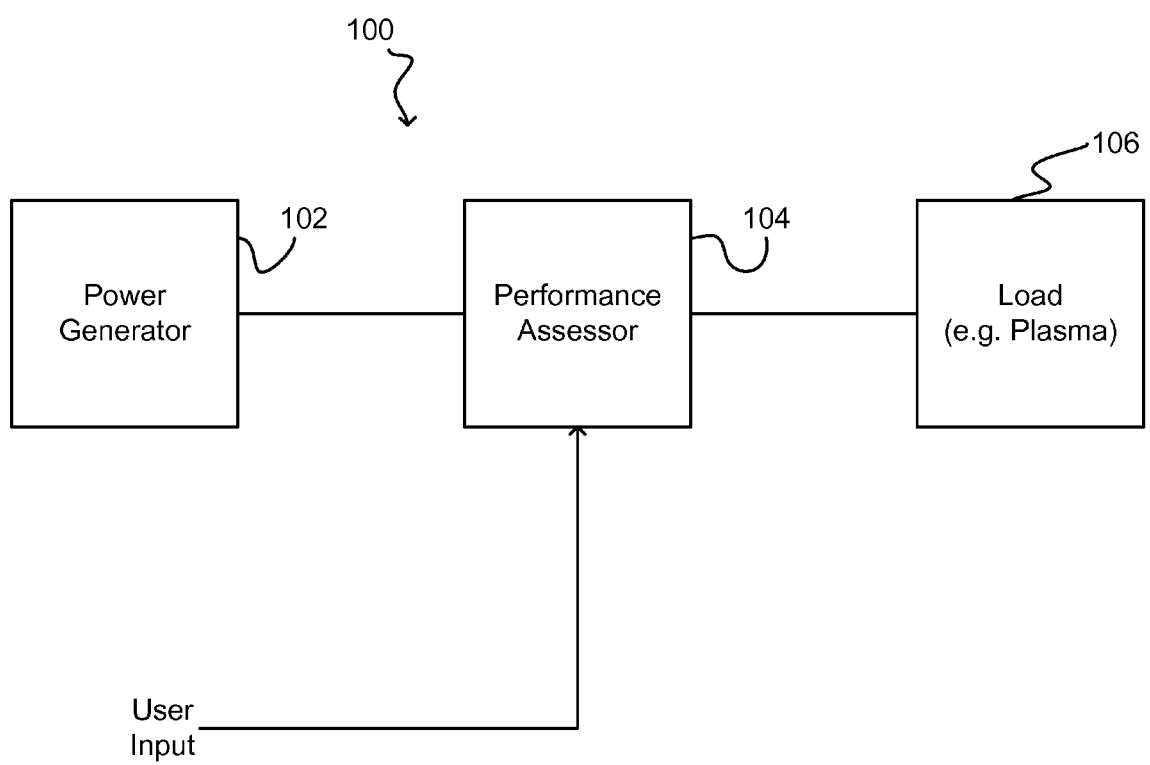
FIG. 1 is a system-level block diagram depicting a representative embodiment of the disclosed power generation system coupled to a load.

Reference is now directed to the drawings, where like or similar elements are designated with identical reference numerals throughout the several views.

Referring to FIG. 1, a block diagram of the disclosed power generation system 100 is shown. A power generator 102 is electrically coupled to a load 106. Coupled between the power generator 102 and the load 106 is a performance assessor 104. Typically, but not always, some type of matching network (not shown) is used to match the load to the generator 102. By correct design of the matching network (either internal or external to the generator), it is possible to transform the impedance of the load 106 to a value close to the reference impedance of the generator 102.

The illustrated arrangement of these components is logical; thus the components can be combined or further separated in an actual implementation, and the components can be connected in a variety of ways without changing the basic operation of the system. For example, the power generator 102 and the performance assessor 104 may be realized by common components and may be within the same housing. Or the power generator 102 and the performance assessor 104 may be implemented and sold separately.

Although not required, the power generator 102 may include a power supply configured to provide a range of power levels and frequencies to facilitate a variety of process applications including etch applications (e.g., silicon, dielectric, metal and strip) and deposition applications (e.g., PECVD, HDP-CVD, PVD, and PEALD). In one variation, the power generator 102 includes a power supply configured to provide power from 30 Watts to 3 kW at frequencies around 13.56 MHz. It is certainly contemplated, however, that the power supply may provide other frequencies and power levels. One exemplary power supply that may be utilized to realize the power generator 102 is sold under the tradename PARAMOUNT by Advanced Energy Industries, Inc. of Fort Collins, Colo.

The measure of how close the load impedance is to the desired impedance can take many forms. Frequently it is expressed as a reflection coefficient, $$\rho = \frac{Z - Z_o}{Z + Z_o^*}$$

where $\rho$ is the reflection coefficient of the impedance Z with respect to the desired impedance $Z_0$. The magnitude of the reflection coefficient ($|\rho|$) is a very convenient way to express how close the impedance Z is to the desired impedance $Z_0$. Both Z and $Z_0$ are in general complex numbers.

Other measures may be used for this purpose. Such other measures, for example, include without limitation, minimum reflected power or maximum delivered power.

Some types of loads, like a plasma for example, can be unstable when configured to operate at the power generator's reference impedance at a particular power level. In such circumstances, the reflected power will not be at or near zero because the load's impedance is not matched to the power generator's reference impedance. Under such circumstances, it has been found to be desirable to assess the power generator's operational efficiency relative to the load's impedance rather than relative to the power generator's reference impedance.

The performance assessor 104, in many embodiments, is configured to receive input from the user of the power generation system 100 defining the operational impedance at the load. The performance assessor 104 is configured to substitute the operational impedance of the load (as input by the user) for the reference impedance of the power generator 102, thereby enabling use of standard performance measurement techniques with respect to the load's operational impedance rather than the power generator's 102 reference impedance. Thus, an alternative reference impedance may be defined, with respect to which metrics of operational efficiency (such as reflected power) may be used to assess performance of the power generator system as depicted in FIG. 1

Figure 2:
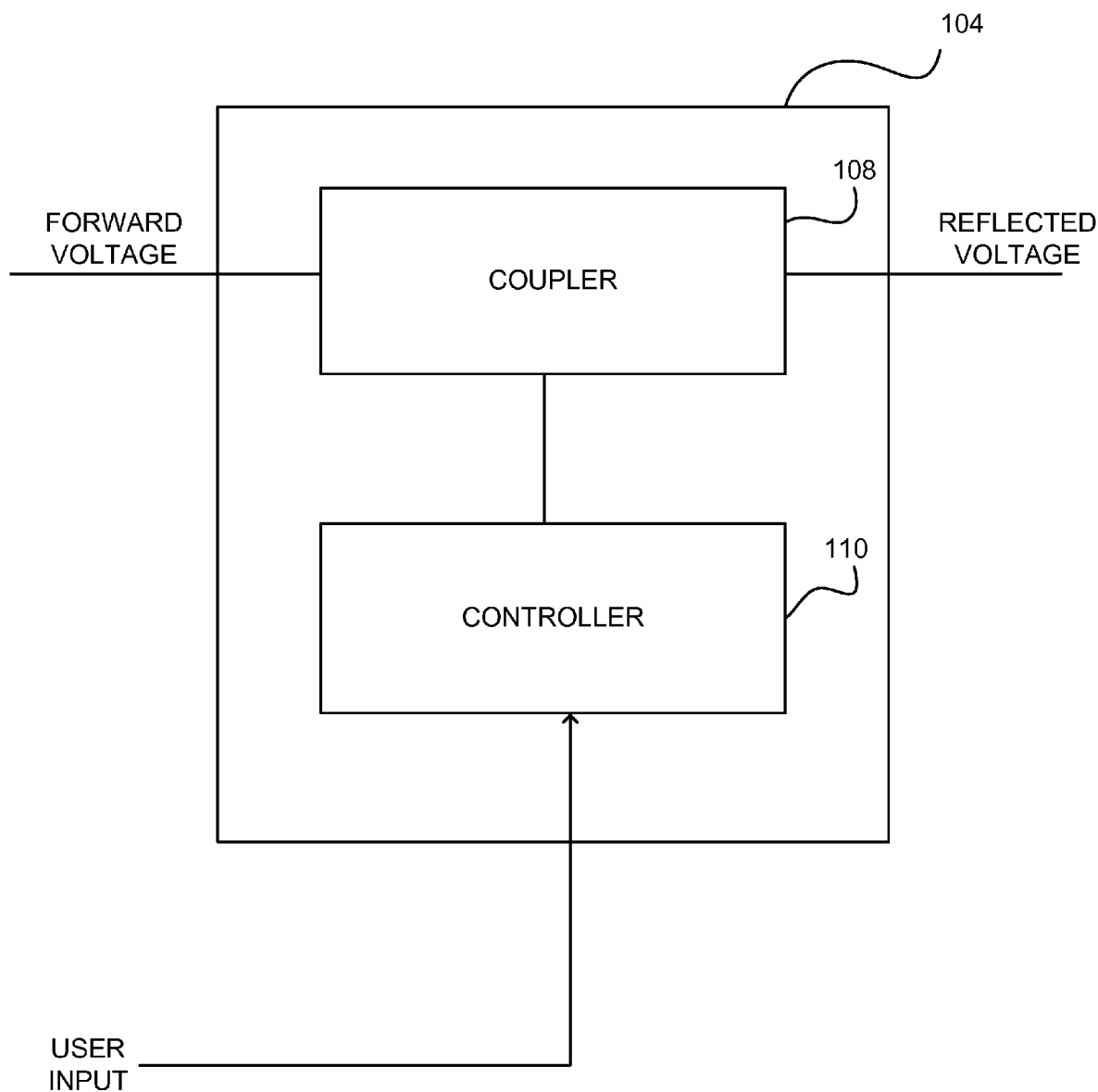
FIG. 2 is a block diagram depicting an exemplary embodiment of the performance assessor of the system depicted in FIG. 1.

Referring to FIG. 2, depicted is an embodiment of an exemplary performance assessor 204 that may be used to realize the performance assessor 104 referenced in FIG. 1. As depicted, a coupler 108 in this embodiment is coupled between the power generator 102 and the load 106, and a controller 110 is coupled to the coupler and is disposed so as to receive a user input. It should be recognized that the depiction of these components is logical; thus the components can be combined or further separated in an actual implementation. Moreover, the construction of these functional components, in light of this specification, is well known to one of ordinary skill in the art.

The coupler 108 is configured to measure one or more characteristics (e.g., forward and reflected voltage) of the power that is applied to the load 106. In many implementations, the coupler 108 is realized by a directional coupler. And one of ordinary skill in the art will appreciate that the coupler 108 may include a transducer, electronics, and processing logic (e.g., instructions embodied in software, hardware, firmware or a combination thereof). U.S. application Ser. No. 12/116,375 entitled System, Method, and Apparatus for Monitoring Power, which is incorporated herein by reference, includes a disclosure of exemplary techniques for monitoring power.

As shown, the controller 110, in this embodiment is configured to receive input data from a user of the system as well as the measurements (e.g., forward and reflected voltage) from the coupler 108. In many implementations, the controller 110 is generally configured to enable a user to redefine the reference impedance so that one or more characteristics of the power applied to the load (e.g., forward and reflected power) may be calculated with respect to the redefined reference impedance.

The controller 110 may be realized by hardware, software, firmware or a combination thereof. It should also be recognized that the functionality of the controller may be realized by components within a generator (e.g., generator 102), within a performance assessor that is separately housed from a generator, or may be distributed among components within both a generator and a performance assessor. And in some implementations, the controller 110 is coupled to a display and is configured to display characteristics (e.g., reflected power) of the power that is applied to a load (e.g., load 106)

In many modes of operation, delivered power may be considered to be independent of the chosen reference impedance. For exemplary purposes, assume that it is desirable to deliver 3000 Watts into a load having a complex impedance of 60+j10 ohms. A 50 ohm-based measurement system will calculate the load reflection coefficient as follows: $\rho=(60+j10-50)/(60+j10+50)=(10+j10)/(110+j10)=0.0984+j0.082$, with the forward power equal to: $1/(1-|\rho|^2)*3000=3050$ Watts, and thus the reflected power is 50 Watts.

If the reference impedance is changed (e.g., by the user) to 60+j10, the forward power will equal the delivered power (3000 W) and the reflected power is 0. Thus, the user may define the reference impedance so that reflected power is approximately zero when a desirable impedance is provided to the generator.

In many implementations, the controller 110 uses a 2 by 2 complex matrix to convert the signals measured by the coupler 108 to the forward and reflected voltages from which forward and reflected power as well as load impedance is calculated by the controller 110. This matrix, for example, may include coefficients that are determined with a calibration procedure for every coupler.

The relationship between the operational load impedance and the generator reference impedance may be characterized as follows: $Pforward\_1 - Preflected\_1 = Pdelivered = Pforward\_2 - Preflected\_2$, where $Pforward\_1$ and $Preflected\_1$ is the split for the generator reference impedance, and $Pforward\_2 - Preflected\_2$ is the split for the load's operational impedance.

Figure 3:
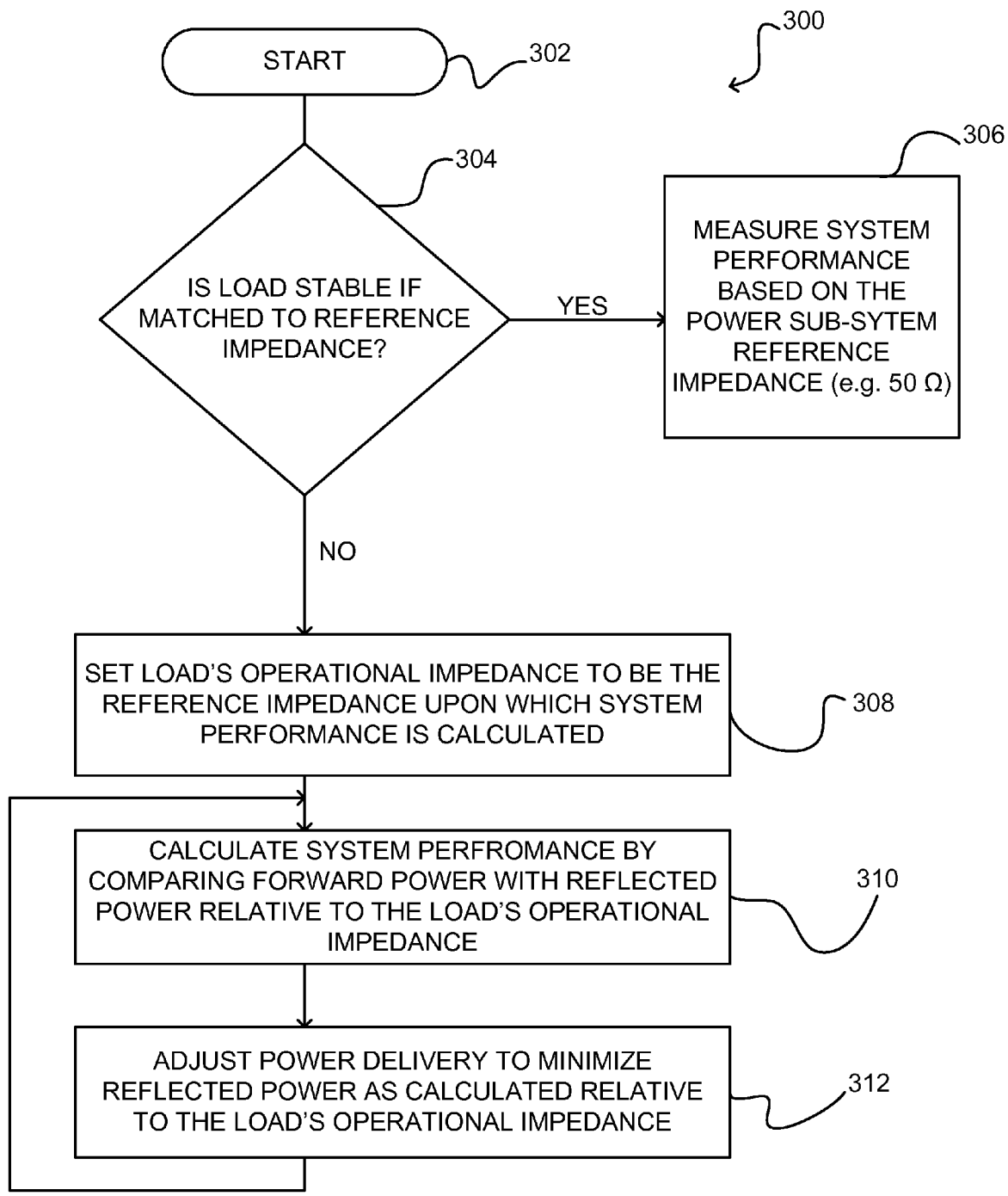
FIG. 3 is a flow diagram depicting a method for defining an alternative reference impedance of a power generator.

Referring now to FIG. 3, depicted is a flow diagram illustrating a method 300 for defining an alternative reference impedance of a power generator with respect to which metrics of operational efficiency (such as reflected power) may be used to assess performance of a power generator system (e.g., system 100). As depicted, the method 300 begins at block 302. At branch 304, the method determines whether the load 106, when coupled to the power generator 102, will be stable under the desired operating conditions, for example, at a specified fixed power delivery level. In one embodiment, the system user provides stability information to the system. If the load 106, operating at desired conditions, will be stable, then the method progresses to block 306 where the system calculates operational performance and efficiency with respect to the reference impedance of the power generator, for example, 50 ohms.

If the load 106, operating at desired conditions, will not be stable, then the method progresses to block 308, where the user sets the operational impedance of the load to be the impedance value upon which system performance and efficiency will be referenced. Next, at block 310, the system calculates both forward power delivered by the power generator to the load, and reflected power, reflected by the load back to the power generator. At block 312, the exemplary method then adjusts performance of the system adjusting parameters, including delivered power, so as to arrive at a desired metric of performance (e.g., reflected power). For example, parameters may be adjusted to minimize reflected power. It should also be recognized that parameters may be adjusted so as to arrive at a desired balance between system stability and power-delivery performance. The process of calculating and adjusting repeat until a desired state of operation (e.g., a desired or predetermined efficiency) is reached, or until operation of the system ceases.

In conclusion, the present application discloses, among other things, a method and apparatus for defining an alternative reference impedance of a power generator, with respect to which metrics of operational efficiency (such as reflected power, among others) may be used to assess performance of the power generator system. Those skilled in the art can readily recognize that numerous variations and substitutions may be made in the disclosure herein, its use, and its configuration to achieve substantially the same results as achieved by the embodiments described herein. Accordingly, there is no intention to limit the claims to the disclosed exemplary forms. Many variations, modifications, and alternative constructions fall within the scope and spirit of the present disclosure as expressed in the claims.

What is claimed is:

1. A power delivery system for applying power to a load comprising a load impedance, the system comprising:
   a power generator comprising a reference impedance configured to apply power to the load; and
   a performance assessor electrically coupled to the power generator and the load, the performance assessor configured to,
      provide indicia of operational performance of the power delivery system, the indicia of the operational performance being relative dependent upon the reference impedance,
      substitute the load impedance for the reference impedance in the indicia of operational performance, and
      enable the indicia of the operational performance to be changed to a desirable range.

2. The power delivery system of claim 1 wherein, the performance assessor is further configured to receive the reference impedance of the load from a user of the power generator.

3. The power delivery system of claim 1 wherein the performance assessor further comprises:
   a coupler to measure a forward voltage signal and a reflected voltage signal; and
   a controller configured to determine a forward power, a reflected power, and the load impedance, wherein each of the forward power, reflected power, and load impedance are based on the forward voltage signal and the reflected voltage signal.

4. The power delivery system of claim 3 wherein the indicia of operational performance is reflected power.

5. The power delivery system of claim 3 wherein the controller is further configured to calculate a reflection coefficient.

6. The power delivery system of claim 3 wherein the controller is further configured to calculate a minimum reflected power.

7. The power delivery system of claim 3 wherein the controller is further configured to calculate a maximum delivered power.

8. A method of managing an application of power with a power generator to a load, comprising:
   electrically coupling a performance assessor to the power generator and the load, wherein the power generator comprises a reference impedance;
   receiving from the performance assessor an indicia of operational performance of the power delivery system,
   receiving from the performance assessor an indication of an effectiveness of the application of power relative to the reference impedance;
   receiving an operational load impedance value, the operational load impedance value differing from the reference impedance;
   using the operational load impedance value to provide another indication of the effectiveness of the application of power; and
   utilizing the another indication of the effectiveness of the application of power to manage the application of power to the load.

9. The method of claim 8, further including: adjusting the application of power so as to maximize the application of power to the load.

10. The method of claim 8 wherein adjusting the application of power includes:
    measuring a forward voltage from the power generator;
    measuring a reflected voltage from the load; and
    calculating a forward power, a reflected power and the operational load impedance from the measured forward voltage and from the measured reflected voltage.

11. The method of claim 10 further comprising calculating a reflection coefficient.

12. The method of claim 10 further comprising calculating a minimum reflected power.

13. The method of claim 10 further comprising calculating a maximum delivered power.

14. The method of claim 8, wherein the indication of an effectiveness of the application of power is reflected power.

15. A method of controlling a power generation system, comprising:
    providing a power generator, having a predefined reference impedance, the power generator configured to deliver power to a load having an operational impedance different from the predefined reference impedance;
    applying power from the power generator to the load; and
    determining an operational efficiency of the power generation system with respect to the operational impedance of the load.

* * * * *